(12) United States Patent
Datta et al.

(10) Patent No.: US 8,487,658 B2
(45) Date of Patent: Jul. 16, 2013

(54) COMPACT AND ROBUST LEVEL SHIFTER LAYOUT DESIGN

(75) Inventors: Animesh Datta, San Diego, CA (US); William James Goodall, III, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 79 days.

(21) Appl. No.: 13/180,598

(22) Filed: Jul. 12, 2011

(65) Prior Publication Data
US 2013/0015882 A1      Jan. 17, 2013

(51) Int. Cl.
*H03K 19/00*   (2006.01)
*H01L 25/00*   (2006.01)

(52) U.S. Cl.
USPC ............... 326/101; 326/80; 326/63; 257/206

(58) Field of Classification Search
None
See application file for complete search history.

(56) References Cited

U.S. PATENT DOCUMENTS

| | | | |
|---|---|---|---|
| 5,780,881 A | 7/1998 | Matsuda et al. | |
| 6,414,518 B1 | 7/2002 | Patel et al. | |
| 6,974,978 B1* | 12/2005 | Possley | 257/204 |
| 7,095,063 B2 | 8/2006 | Cohn et al. | |
| 7,408,269 B2 | 8/2008 | Joshi et al. | |
| 2003/0231046 A1 | 12/2003 | Giacomini et al. | |
| 2004/0225985 A1 | 11/2004 | Kashiwagi et al. | |
| 2008/0143418 A1 | 6/2008 | Lu et al. | |
| 2008/0265936 A1 | 10/2008 | Vora | |
| 2009/0108904 A1 | 4/2009 | Shiffer, II | |
| 2010/0214002 A1 | 8/2010 | Miyoshi et al. | |
| 2010/0238744 A1 | 9/2010 | Yano | |
| 2011/0001538 A1 | 1/2011 | Alam | |
| 2011/0031944 A1* | 2/2011 | Stirk et al. | 323/234 |
| 2011/0266631 A1* | 11/2011 | Morino et al. | 257/371 |

FOREIGN PATENT DOCUMENTS

| | | |
|---|---|---|
| JP | 2008067411 A | 3/2008 |
| WO | 2006025025 A1 | 3/2006 |

OTHER PUBLICATIONS

International Search Report and Written Opinion—PCT/US2012/046562—ISA/EPO—Sep. 24, 2012.

* cited by examiner

*Primary Examiner* — Jany Richardson
(74) *Attorney, Agent, or Firm* — Sam Talpalatsky; Nicholas J. Pauley; Joseph Agusta

(57) ABSTRACT

Method and apparatus for voltage level shifters (VLS) design in bulk CMOS technology. A multi-voltage circuit or VLS that operate with different voltage levels and that provides area and power savings for multi-bit implementation of level shifter design. A two-bit VLS to shift bits from a first voltage level logic to a second voltage level logic. The VLS formed with a first N-well in a substrate. The VLS formed with a second N-well in the substrate, adjacent to a side of the first N-well. The VLS formed with a third N-well in the substrate, adjacent to a side of the first N-well and opposite the second N-well. A first one-bit VLS circuit having a portion formed on the first N-well and a portion formed on the second N-well. A second bit VLS circuit having a portion formed on the first N-well and a portion formed on the third N-well.

23 Claims, 5 Drawing Sheets

Compact physical design of 2-bit shifter layout

Layout architecture of 1-bit level shifter

Conventional multi-bit level shifter layout architecture

Compact physical design of 2-bit shifter layout

COMPACT AND ROBUST LEVEL SHIFTER LAYOUT DESIGN

FIELD OF DISCLOSURE

The field of invention relates to a semiconductor device and methods of manufacturing a semiconductor device handling a plurality of voltage, specifically multi-voltage circuits for shifting the voltage level between voltage domains.

BACKGROUND

Integrated circuit devices containing several types of functional circuit are sometimes required to handle a plurality of voltage levels. Such devices are often known as multi-voltage level devices. Multi-voltage level devices contain a high-voltage circuit driven by a relatively high voltage power supply and a low-voltage circuit driven by a relatively low-voltage power supply. Multi-voltage circuits include but are not limited to voltage level shifters (VLS), isolation cell, retention registers, always on logic and similar components.

Power consumption of integrated circuits may be reduced and efficiencies may be increased by reducing operating voltages of the integrated circuits. Some circuits are more amenable to lower operating voltages than others. Where integrated circuits within a system operate at lower voltages, conflicts or contention may arise between the circuits. These conflicts and contention can be alleviated by level shifting the operating voltage of part of the circuits to higher voltage. But level shifting may introduce delays.

Technology scaling reduces the delay of circuit elements, enhancing the operating frequency of an integrated circuit (IC) device. The density and number of transistors on an IC are increased by scaling the feature size. By utilizing this growing number of available transistors in each new technology, novel circuit techniques can be employed further enhancing the performance of the ICs beyond the levels made possible by simply shrinking.

SUMMARY

The described features generally relate to one or more improved systems, methods and/or apparatuses for compact and robust level shifter layout design.

Further scope of the applicability of the described methods and apparatuses will become apparent from the following detailed description, claims, and drawings. The detailed description and specific examples, while indicating specific examples of the disclosure and claims, are given by way of illustration only, since various changes and modifications within the spirit and scope of the description will become apparent to those skilled in the art.

Embodiments of the present invention do not rely on particular transistor level circuit implementation of level shifters and may be applied to any possible level shifter circuit styles. Embodiment of this invention is not limited to only level shifter circuits, and is applicable to any generic multi-voltage circuit's layout design. Embodiments of the present invention seek to provide a VLS that operate for different voltage levels and that provides area and power savings for multi-bit implementation of level shifter design.

Accordingly an embodiment can include a two-bit multi-voltage circuit to shift each of two bits from a first voltage level logic to a second voltage level logic, comprising: a first N-well formed in a substrate; a second N-well formed in the substrate, adjacent to a side of the first N-well; and a third N-well formed in the substrate, adjacent to a side of the first N-well opposite the first N-well; a first one-bit VLS circuit having a portion formed on the first N-well and a portion formed on the second N-well; and a second bit VLS circuit having a portion formed on the first N-well and a portion formed on the third N-well.

Another embodiment can include a four-bit multi-voltage circuit to shift each of four bits from a first voltage level logic to a second voltage level logic, comprising: a first N-well formed in a substrate; a second N-well formed in the substrate, adjacent to a side of the first N-well; a third N-well formed in the substrate, adjacent to a side of the first N-well; a first one-bit VLS circuit having a portion formed on the first N-well and a portion formed the second N-well; a second bit VLS circuit having a portion formed on the first N-well and a portion formed on the second N-well; a third one-bit VLS circuit having a portion formed on the first N-well and a portion formed the third N-well; and a fourth one-bit VLS circuit having a portion formed on the first N-well and a portion formed the third N-well.

Another embodiment can include a method for reducing die area in a two-bit multi-voltage circuit to shift each of two bits from a first voltage level logic to a second voltage level logic, wherein a first N-well formed in a substrate, a second N-well formed in the substrate, adjacent to a side of the first N-well, and a third N-well formed in the substrate, adjacent to a side of the first N-well opposite the second N-well, comprising: forming a first one-bit VLS circuit having a portion on the first N-well and a portion formed on the second N-well; and forming a second bit VLS circuit having a portion on the first N-well and a portion formed on the third N-well.

Another embodiment can include an apparatus for reducing die area in a two-bit multi-voltage circuit to shift each of two bits from a first voltage level logic to a second voltage level logic, wherein a first N-well formed in a substrate, a second N-well formed in the substrate, adjacent to a side of the first N-well, and a third N-well formed in the substrate, adjacent to a side of the first N-well opposite the second N-well, the apparatus comprising: logic configured to form a first one-bit VLS circuit having a portion on the first N-well and a portion formed on the second N-well; and logic configured to form a second bit VLS circuit having a portion on the first N-well and a portion formed on the third N-well.

Another embodiment can include an apparatus for reducing die area in a two-bit multi-voltage circuit to shift each of two bits from a first voltage level logic to a second voltage level logic, wherein a first N-well formed in a substrate, a second N-well formed in the substrate, adjacent to a side of the first N-well, and a third N-well formed in the substrate, adjacent to a side of the first N-well opposite the second N-well, the apparatus comprising: means for forming a first one-bit VLS circuit having a portion on the first N-well and a portion formed on the second N-well; and means for forming a second bit VLS circuit having a portion on the first N-well and a portion formed on the third N-well.

Another embodiment can include a method for reducing die area in a four-bit multi-voltage circuit to shift each of four bits from a first voltage level logic to a second voltage level logic, wherein a first N-well formed in a substrate, a second N-well formed in the substrate, adjacent to a side of the first N-well, a third N-well formed in the substrate, adjacent to a side of the first N-well, comprising: forming a first one-bit VLS circuit having a portion on the first N-well and a portion formed the second N-well; forming a second bit VLS circuit having a portion on the first N-well and a portion formed on the second N-well; forming a third one-bit VLS circuit having a portion on the first N-well and a portion formed the third N-well; and forming a fourth one-bit VLS circuit having a portion on the first N-well and a portion formed the third N-well.

Another embodiment can include an apparatus for reducing die area in a four-bit multi-voltage circuit to shift each of four bits from a first voltage level logic to a second voltage level logic, wherein a first N-well formed in a substrate, a second N-well formed in the substrate, adjacent to a side of the first N-well, a third N-well formed in the substrate, adjacent to a side of the first N-well, the apparatus comprising: logic configured to form a first one-bit VLS circuit having a portion on the first N-well and a portion formed the second N-well; logic configured to form a second bit VLS circuit having a portion on the first N-well and a portion formed on the second N-well; logic configured to form a third one-bit VLS circuit having a portion on the first N-well and a portion formed the third N-well; and logic configured to form a fourth one-bit VLS circuit having a portion on the first N-well and a portion formed the third N-well.

Another embodiment can include apparatus for reducing die area in a four-bit multi-voltage circuit to shift each of four bits from a first voltage level logic to a second voltage level logic, wherein a first N-well formed in a substrate, a second N-well formed in the substrate, adjacent to a side of the first N-well, a third N-well formed in the substrate, adjacent to a side of the first N-well, the apparatus comprising: means for forming a first one-bit VLS circuit having a portion on the first N-well and a portion formed the second N-well; means for forming a second bit VLS circuit having a portion on the first N-well and a portion formed on the second N-well; means for forming a third one-bit VLS circuit having a portion on the first N-well and a portion formed the third N-well; and means for forming a fourth one-bit VLS circuit having a portion on the first N-well and a portion formed the third N-well.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Figure 1:
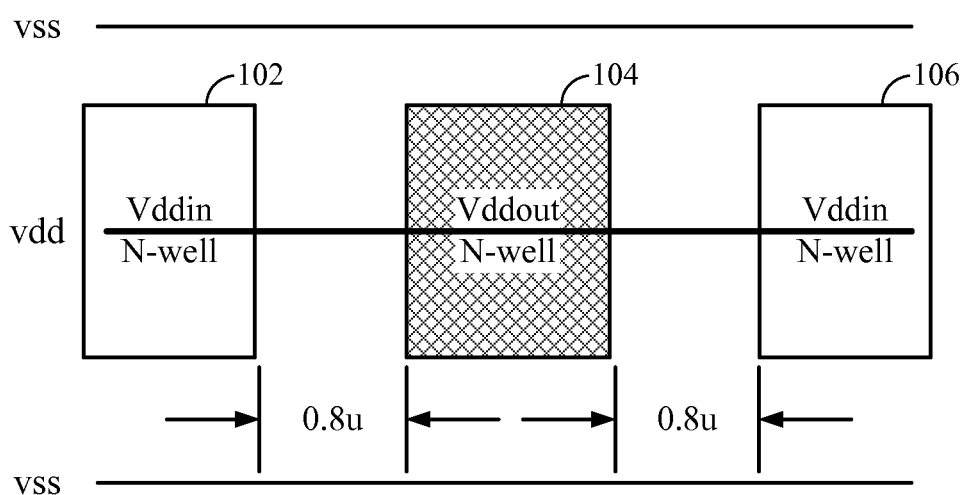
FIG. 1 is a conventional 1-bit voltage level shifter.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention. Embodiments of the disclosure may be suitably employed in any device which includes active integrated circuitry including memory and on-chip circuitry for test and characterization.

The foregoing disclosed devices and methods are typically designed and are configured into GDSII and GERBER computer files, stored on a computer readable media. These files are in turn provided to fabrication handlers who fabricate devices based on these files. The resulting products are semiconductor wafers that are then cut into semiconductor die and packaged into a semiconductor chip. The chips are then employed in devices described above.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

The power density of IC chips is increasing to support more features and various operating modes in portable electronic devices, especially for deep submicron technology. Deep submicron technology uses transistors of smaller size with faster switching rates (e.g., 45 nm and smaller nodes). In the IC chips of a portable electronic device, such as mobile and cellular, having dynamic supply voltage ($V_{DD}$) and frequency scaling can be a technique for active power (P) reduction due to square dependence of $V_{DD}$ (i.e., P α $V^2_{DD}$). Therefore, IC chips employ different voltage domains for different circuit blocks. Reasons include optimizing trade-offs among, for example, speed, noise tolerance and power consumption to account for different circuit blocks having different priorities.

However, decreasing the operational voltage level of one circuit in a system can create compatibility problems where some other integrated circuit or other device is designed to operate at predetermined incompatible specific voltage level, or is accessible only via a bus that operates optimally at a different (e.g., higher) voltage logic level. For example, some circuits within a chip may operate at low voltage core-logic level to reduce power consumption and to interface with other chips operating at the same low voltage, while other circuits in the same chip may operate at higher voltage levels to interface with a higher logic voltage chip or bus or to operate an electro-mechanical device. Also, there are many existing integrated circuits that cannot have their operating voltage altered; yet, newer lower voltage circuits must interface with them. For example, if core logic voltage were reduced from a nominal 1.2 volts to 0.7 V, the logic value represented by 0.7 V would ordinarily be insufficient to properly drive another transistor circuit operating from a 1.2 V power supply. The 0.7 V logic input to a 1.2 volt CMOS circuit would cause a prolonged transitional (i.e., conducting) state potentially resulting in damaging currents in the CMOS circuits tied to a 1.2 volt supply. The rise, fall, and propagation times of signals would be detrimentally affected by the difference between core logic voltage and the circuits operating at a higher logic voltage. Therefore, to lower the voltage of integrated circuits and to consume less power, while still enabling their interaction with existing hardware components operating at a different voltage, some form of voltage level-shifting interface circuit (e.g., level-shifting buffer circuit) is required.

Consequently, many complementary metal oxide semiconductor (CMOS) integrated circuits require more than one power supply per chip. For instance, a split rail design is utilized when the internal or core-logic voltage, $V_{DD}in$, operates at a different (e.g., lower) voltage level than the input/output (I/O) interface voltage or output driver voltage, $V_{DD}out$. The integrated circuit core voltage, $V_{DD}in$, applied to a given circuit may be fixed or variable depending on the integrated circuit technology, design factors, and by the performance requirements and the power supply and heat dissipation characteristics of the chip.

As a result, a signal traversing from one voltage domain to another must pass through a multi-voltage circuit or voltage level shifter (VLS) cell to maintain its logical value. Multi-voltage circuits include but are not limited to VLS, isolation cell, retention registers, always on logic and other similar components. To reduce chip power consumption and increase battery life, portable electronic device chip-sets employ a large number of VLS cells. However, this necessitates very compact level shifters design to limit the die area overhead. To reduce chip power dissipation, VLS cells need to consume lower static power and keep robust functionally. This requires reliable operation across wider range of input and output voltages without consuming extra power.

VLS cells are known to convert a signal from one voltage domain to a signal suitable for another voltage domain. A conventional VLS cell converts signals between an input domain (e.g., $V_{DD}in$) and an output domain (e.g., $V_{DD}out$). In addition, a conventional VLS cell can prevent excessive leakage to improve battery life and allow reliable functionality across a wide range of voltage domains. The attached related art FIG. 1 shows typical layout (Physical Design) structure of 1-bit (with single input signal) VLS cell which is can be placed next to another cell of input voltage domain ($V_{DD}in$). The FIG. 1 conventional one-bit VLS circuit requires three N-wells, two $V_{DD}in$ N-well 102 and 106 and a $V_{DD}out$ N-well 104 for bit 0. This allows circuits that work at different voltages to properly interface with each other without additional leakage power.

Since the adjacent N-wells in the FIG. 1 VLS have alternating different voltages, design rules require these adjacent N-wells have a minimum spacing for correct functional operation. For example, as shown in FIG. 1, the minimum spacing between the two N-wells 102 and 104 is 0.8 µm. In addition the minimum spacing between the other two N-wells 104 and 106 is also 0.8 µm.

Figure 5:
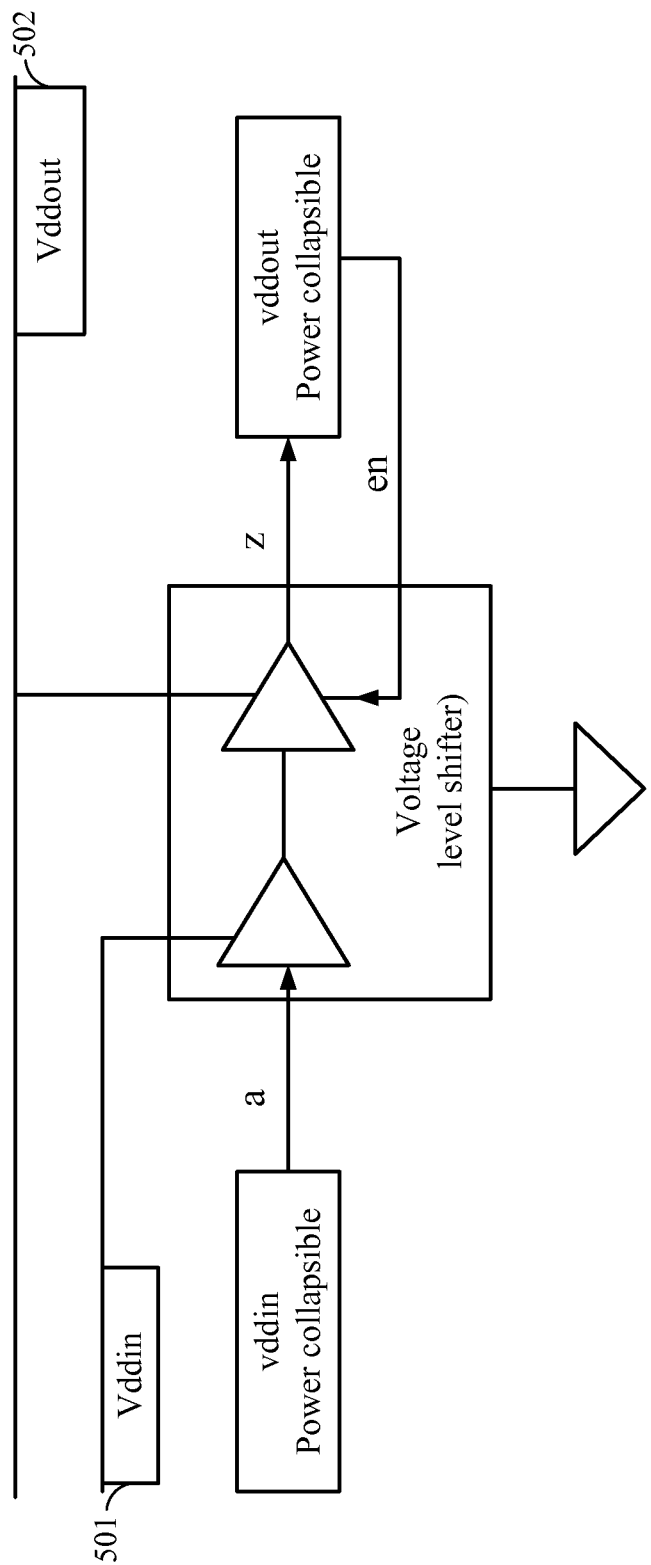
FIG. 5 illustrates a generic 1-bit voltage level shifter functional circuit, whose physical design or layout can be implemented as 1-bit level shifter in any of the embodiments.

The attached related art FIG. 5 depicts a functional circuit diagram of a conventional 1-bit VLS layout. A conventional VLS cell can employ two stage complementary metal-oxide-semiconductor (CMOS) circuits, with a first stage operating at a first voltage 501, as shown by $V_{DD}in$ in FIG. 5, and a second stage operating at a second voltage 502, as shown by $V_{DD}out$. When their threshold voltages and device strengths are properly adjusted, they can perform voltage level shifting as desired. However, the conventional VLS may occupy large layout areas because a first N-well for a CMOS transistor in the first stage is coupled to a first voltage, while a second N-well for a CMOS transistor in the second state is coupled to a second voltage, therefore the first and second N-wells have to be separated and have to maintain a certain distance, which is determined by the technology being used.

Figure 2:
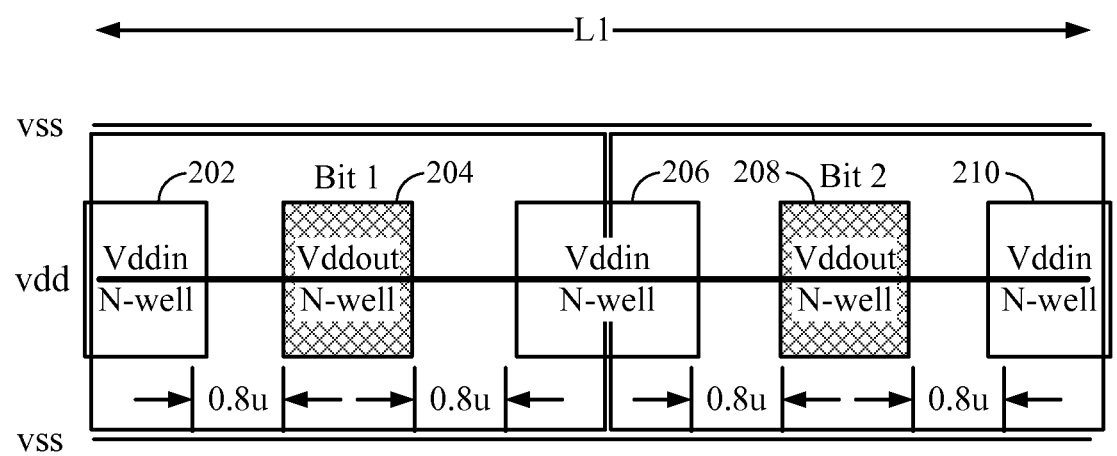
FIG. 2 is a conventional 2-bit voltage level shifter.

The attached related art FIG. 2 shows a conventional N-well arrangement for a conventional two-bit $V_{DDin}$ (e.g., 0.7 V) to $V_{DDout}$ (e.g., 1.2 V) VLS circuit. The FIG. 2 conventional two-bit VLS circuit requires five N-wells, namely one shared $V_{DD}in$ N-well 206, a $V_{DD}in$ N-well 202 and a $V_{DD}out$ N-well 204 for bit 0, and $V_{DD}out$ N-well 208 and $V_{DD}in$ N-well 210 for bit 1. Similar to FIG. 1, this example illustrates that a minimum spacing between each N-wells 202, 204, 206, 208 and 210 to be at least 0.8 µm.

Because the adjacent N-wells in the FIG. 2 VLS have alternating different voltages, design rules require these adjacent N-wells have a minimum spacing. The related art FIG. 2 shows, for example, a minimum spacing of 0.8 µm. Notably, this minimum spacing requirement between VLS adjacent N-wells does not fully scale with the feature size. For example, if an IC implemented in 65 nm technology is scaled down to 32 nm (i.e., scaled down by approximately half), the minimum spacing between adjacent N-wells of the IC's VLS circuits does not likewise scale by half.

Therefore, due to non-shrinking latch-up design rules (N-well to N-well spacing) and presence of multiple $V_{DD}$ domains, physical design of a VLS circuit consumes large die area. In addition, due to presence of three separate N-well regions in a VLS circuit, the physical area of level shifter cell does not shrink proportionally (expected area scaling is ~50%) when technology nodes get smaller as shown in table 1. This becomes even more apparent in 32 nm and smaller process node.

TABLE 1

Area scaling of level shifter layout design

| Technology node | Cell area (sq. um) | Area scaling from previous node |
|---|---|---|
| 65 nm | 21.6 | NA |
| 45 nm | 12.3 | 57% |
| 32 nm | 7.6 | 61% |

Physical design or layout structure of level shifter circuit incurs significant area overhead compared to regular CMOS logic. In particular when multiple level shifter instances are placed together they result in multiple N-well voltage islands as shown in FIG. 2. Larger layout footprint increases length of both the internal and external interconnects length increasing dynamic power as well as die area. There is no known method technique to escape from fixed area overhead in the physical design of the level shifter. In 32 nm and smaller technology nodes the presence of strong layout proximity effects further increases area overhead of level shifter cells due to presence of protective layout structures.

Accordingly there is a need for VLS to have a reduced area and is cost efficient to fabricate. Embodiments of the present invention seek to provide a VLS that operate for different voltage levels and that provides area and power savings for multi-bit implementation of level shifter design. Embodiments of the present invention do not rely on particular transistor level circuit implementation of level shifters and may be applied to any possible level shifter circuit styles. Embodiments of the present invention are not limited to level shifter circuits, and are applicable to any generic layout design for multi-voltage circuits. The present invention can be extended to any circuit requiring two or more different voltage domains and hence multiple N-well islands in the design.

Embodiments of the present invention relate to a physical design methodology for compact layout of VLS cells in multiple bits. The present invention utilizes the presence of separate voltage N-well islands inside a cell. Several key physical designs are used to improve design robustness and lower the power dissipation. By reducing the N-well to N-well spacing occurrence, the present invention can allow for a more compact layout of VLS cells in multiple bits. The present invention can allow for improved design robustness and low voltage performance, which includes better $V_{DD}$min.

Figure 3A:
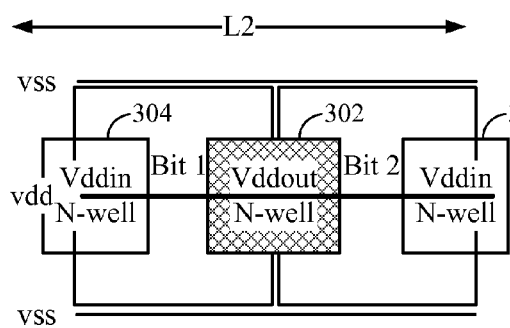
FIG. 3A is a 2-bit voltage level shifter according to an embodiment of the present invention.
Figure 3B:
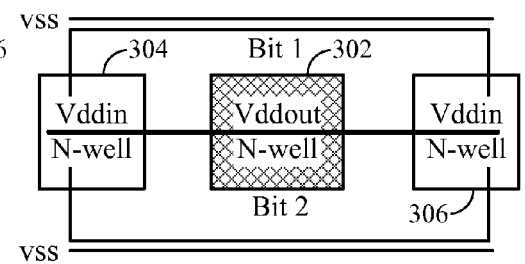
FIG. 3B is a 2-bit voltage level shifter according to another embodiment of the present invention.

FIGS. 3A and 3B shows two embodiments of the present invention. These embodiments use area efficient physical design for a 2-bit VLS with a pair of input and output signals. FIGS. 3A and 3B illustrate example of large area saving which is achieved by merging two identical 1-bit level shifter layouts differently than a conventional 1-bit layout, as illustrated in FIG. 1. In the embodiments illustrated in FIGS. 3A and 3B, the 1-bit component layouts are not self-sufficient and cannot be used solely as a compact 1-bit level shifter layout design. Therefore, the embodiments illustrated in FIGS. 3A and 3B are examples for a 2-bit VLS, which include two combined component 1-bit level shifter layouts. In FIG. 3A, the component 1-bit level shifter layouts is composed of one N-well separation between the N-wells and two standard cell row, which has two $V_{SS}$ and one $V_{DD}$ power rail. In FIG. 3B, the component 1-bit level shifter layouts is composed of two N-well separations between the N-wells and one standard cell row, which has one $V_{SS}$ and one $V_{DD}$ power rail. As shown in table 2, in both embodiments, there can be a forty percent area savings as compared to two separate 1-bit VLS cells as illustrated in FIG. 2.

This embodiment, as illustrated at FIG. 3A forms a two-bit VLS circuit using three (3) N-wells, instead of the five (5) required in the conventional arrangements shown at FIG. 2. The overall width, L2, is approximately half (½) of the L1 width of the conventional arrangement shown in FIG. 2. The FIG. 3A embodiment uses a center N-well 302, biased at $V_{DD}$out, and one N-well biased at $V_{DD}$in on either side of the center N-well 304, namely N-well 304 at the left and N-well 306 at the right. The spacing SP1 between the differently biased N-wells 304 and 302 is the same as between the differently biased N-wells 302 and 306. The spacing SP1 may be substantially the same as the spacing between adjacent N-wells in the conventional arrangement of the related art FIG. 2.

The FIG. 3A embodiment employs the center N-well 302, biased at $V_{DD}$out, for the $V_{DD}$out portion of both the bit 1 and the bit 2 VLS sections of the two-bit VLS circuit. The FIG. 3A embodiment employs the left N-well 304 for only the bit 1 VLS section, and the right N-well 306 for only the bit 2 VLS section. FIG. 3B shows another embodiment, having the same N-well arrangement as the FIG. 3A embodiment, but employing all three N-wells 302, 304 and 306 for both the bit 1 VLS section and the bit 2 VLS section.

In the embodiments shown in FIG. 3A and FIG. 3B, large area saving is achieved by merging two identical 1-bit level shifter layouts, as compared to the conventional 1-bit layout as depicted in FIG. 1. However, the embodiments shown in FIG. 3A and FIG. 3B, the 1-bit component layouts are not self-sufficient and cannot be used as compact 1-bit level shifter layout design. To summarize the component 1-bit level shifter layouts, from FIG. 3A comprises of only one N-well separation between them and two standard cell row, which has two $V_{SS}$ and one $V_{DD}$ power rail. The component 1-bit level shifter layouts, from FIG. 3B comprises of two N-well separations between them and of only one standard cell row, which has one $V_{SS}$ and one $V_{DD}$ power rail. In the embodiments of FIG. 3A and FIG. 3B, there can be a forty percent area savings as compared to two separate 1-bit cells as depicted FIG. 2.

Figure 4:
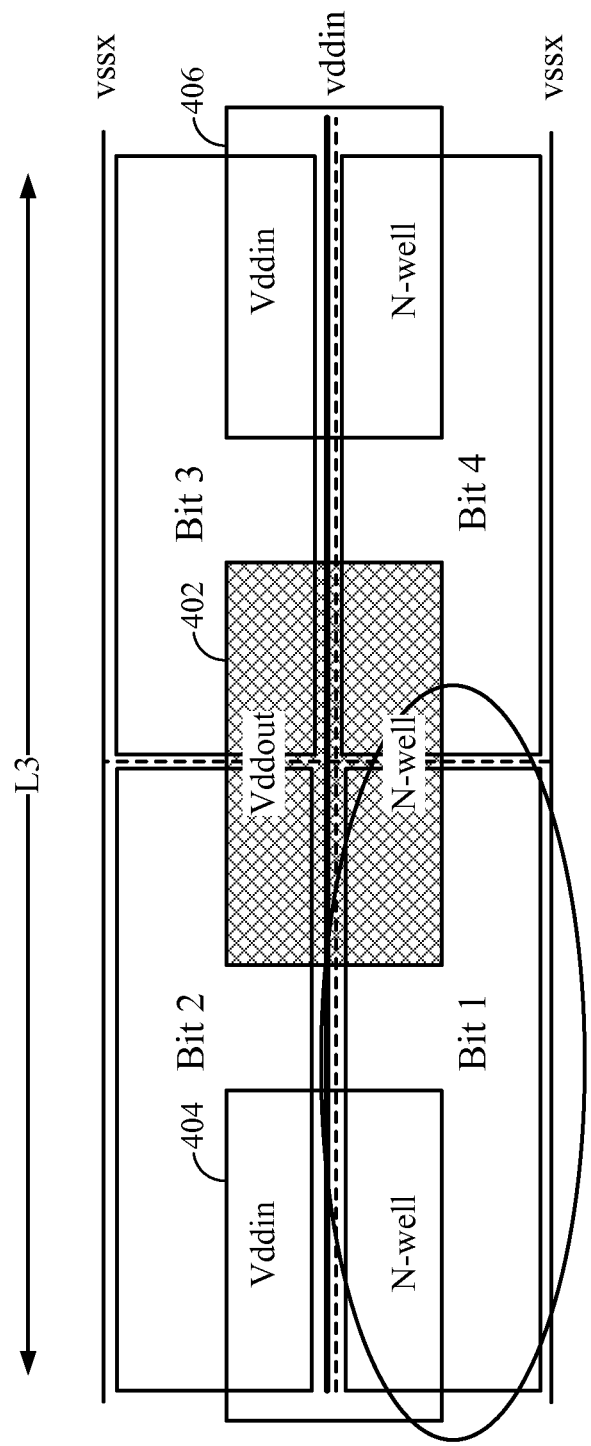
FIG. 4 is a 4-bit voltage level shifter according to another embodiment of the present invention.

In another embodiment, FIG. 4 illustrates a physical design method of a 4-bit VLS. As shown in table 2, with the FIG. 4 embodiment, there can be a fifty percent area savings as compared to four separate 1-bit VLS cells as illustrated by having two 2-bit VLS, as shown in FIG. 2, side-by-side. In this embodiment, the component 1-bit level shifter layouts are composed of only one N-well separation between the N-wells and of only 1 standard cell row, which has one $V_{SS}$ and one $V_{DD}$ power rail per bit. Each component 1-bit level shifter is merged both vertically and horizontally together to form a design rule checker clean physical design of a 4-bit VLS. The 1-bit component layout is not design rule checker clean and cannot be used as compact 1-bit level shifter layout design by itself.

Additional advantages of the embodiment depicted in FIG. 4 are that in a multi-bit design, shared clamp or isolation circuitry, if needed can further reduce area and power saving. Also, symmetrical design and placement of critical devices can ensure better design robustness and low voltage performance from device variation (e.g., in a $V_{DD}$min point of view). Smaller length of interconnects between different bits reduces the capacitive loading and hence the dynamic power dissipation of this embodiment compared to conventional physical design implementation.

With reference to FIG. 4, the VLS is essentially a superposed combination of the FIGS. 3A and 3B embodiments, achieving a four-bit VLS with the same general arrangement of three N-wells. The FIG. 4 embodiment employs the center N-well 402 for all four one-bit sections of the VLS, i.e., for each of the bit 1, bit 2, bit 3 and bit 4 VLS sections. The left N-well 404 is employed for both the bit 1 and bit 2 VLS sections, similar to the left N-well 304 of the FIG. 3B embodiment being employed for the bit 1 and bit 2 sections of its two-bit VLS. Likewise, the right N-well 406 of the FIG. 4 embodiment is employed for both the bit 3 and bit 4 VLS sections of its four-bit VLS, similar to the right N-well 306 of the FIG. 3B embodiment being employed, as described above, for the bit 1 and bit 2 sections of its two-bit VLS. The spacing SP2 between the differently biased N-wells 402 and 404 may be the same as between the differently biased N-wells 404 and 406, and may be substantially the same as SP1 of the FIGS. 3A and 3B embodiments. The N-wells 402, 404 and 406 may be somewhat larger in area than the N-wells 302, 304 and 306 of the FIGS. 3A and 3B embodiments.

The overall length L3 may be approximately twice L2 of the FIGS. 3A and 3B embodiments. The FIG. 4 embodiment may be approximately the same area size as the conventional layout shown in FIG. 2, which is a two-bit VLS comprising of five N-wells.

TABLE 2

Area saving with compact multi-bit level shifter layout methodology in recent semiconductor manufacturing technologies

| Cell Type | 45 nm area saving | 32 nm area saving |
|---|---|---|
| 2-bit | 40% | 45% |
| 4-bit | 52% | 55% |

The present invention allows for a compact hierarchical physical design methodology to improve multi-rail VLS standard cell design. The present invention does not rely on any particular circuit implementation of level shifter and can be applied to all possible level shifter circuit styles. The present invention can consist of stitching together to produce an error free design from several symmetrical components in different orientation that are not individually self-sufficient in design. The present invention is not limited to voltage level shifter cells, and can be applied to a number of different cell families that involves multiple N-well islands. The present invention is not limited to any particular standard cell architecture and can easily be adapted to different cell architecture and style. The present invention can be scalable to future process technology nodes with smaller geometries and larger context sensitivity.

The present invention can be successfully employed in two different standard cell architecture, such as, but not limited to 45 nm and 32 nm technology nodes. The present invention can demonstrate significant area (e.g., over 50%) and power savings for multi-bit implementation of VLS design technologies, including but not limited to 45 nm, 32 nm and smaller process technologies.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for compact and robust voltage level shifters design. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A multi-voltage circuit to shift each of two bits from a first voltage level logic to a second voltage level logic, comprising:
   a first N-well formed in a substrate;
   a second N-well formed in the substrate, adjacent to a side of the first N-well;
   a third N-well formed in the substrate, adjacent to a side of the first N-well opposite the second N-well;
   a first one-bit voltage level shift (VLS) circuit having a portion formed on the first N-well and a portion formed on the second N-well; and
   a second one-bit VLS circuit having a portion formed on the first N-well and a portion formed on the third N-well;
   the first one-bit VLS circuit and the second one-bit VLS circuit to provide a pair of output signals at the first N-well.

2. The multi-voltage circuit of claim 1, wherein the multi-voltage circuit is a voltage level shifter, an isolation cell, a retention register, or an always on logic component integrated in at least one semiconductor die.

3. The multi-voltage circuit of claim 1, wherein there is significant die area reduction and switching power saving, due to reduced length of interconnects inside cell and reduced length of top level connection, as compared to two separate 1-bit conventional multi-voltage circuit cells side-by-side.

4. The multi-voltage circuit of claim 1, wherein the first, second and third N-wells are arranged in a row with the first N-well at a center position.

5. The multi-voltage circuit of claim 1, wherein the first N-well is biased at the second voltage level, and the second and third N-wells are biased at the first voltage level.

6. The multi-voltage circuit of claim 5, wherein multi-voltage has one N-well separation between the N-wells and is comprising of two standard cell row, which includes two $V_{SS}$ and one $V_{DD}$ power rail.

7. The multi-voltage circuit of claim 1, wherein the first N-well is biased at the first voltage level, and the second N-well and third N-well is biased at the second voltage level.

8. The multi-voltage circuit of claim 7, wherein multi-voltage has N-well separations between the N-wells and is comprising of one standard cell row, which includes one $V_{SS}$ and one $V_{DD}$ power rail.

9. A four-bit multi-voltage circuit to shift each of four bits from a first voltage level logic to a second voltage level logic, comprising:
   a first N-well formed in a substrate;
   a second N-well formed in the substrate, adjacent to a side of the first N-well;
   a third N-well formed in the substrate, adjacent to a side of the first N-well opposite the second N-well;

a first one-bit voltage level shift (VLS) circuit having a portion formed on the first N-well and a portion formed the second N-well;

a second one-bit VLS circuit having a portion formed on the first N-well and a portion formed on the second N-well;

a third one-bit VLS circuit having a portion formed on the first N-well and a portion formed the third N-well; and a fourth one-bit VLS circuit having a portion formed on the N-well first and a portion formed the third N-well.

10. The four-bit multi-voltage circuit of claim 9, wherein the multi-voltage circuit is a voltage level shifter, an isolation cell, a retention register, or an always on logic component.

11. The four-bit multi-voltage circuit of claim 9, wherein there is more than a fifty percent area reduction and significant switching power savings as compared to four separate 1-bit multi-voltage circuit cells in a square layout formation.

12. The four-bit multi-voltage circuit of claim 9, wherein the first, second and third N-wells are arranged in a row with the first N-well at a center position.

13. The four-bit multi-voltage circuit of claim 9, wherein the first N-well is biased at the second voltage level, and the second and third N-wells are biased at the first voltage level.

14. The four-bit multi-voltage circuit of claim 9, wherein the first N-well is biased at the first voltage level, and the second and third N-wells are biased at the second voltage level.

15. The four-bit multi-voltage circuit of claim 9, wherein each 1-bit level shifter layouts in the multi-voltage circuit is composed of only one N-well separation between the N-wells and of only one standard cell row, which includes one $V_{SS}$ and one $V_{DD}$ power rail per bit.

16. A method for reducing die area, and switching power in a two-bit multi-voltage circuit to shift each of two bits from a first voltage level logic to a second voltage level logic, wherein a first N-well formed in a substrate, a second N-well formed in the substrate, adjacent to a side of the first N-well, and a third N-well formed in the substrate, adjacent to a side of the first N-well opposite the second N-well, comprising:

forming a first one-bit voltage level shift (VLS) circuit having a portion on the first N-well and a portion formed on the second N-well; and forming a second one-bit VLS circuit having a portion on the first N-well and a portion formed on the third N-well;

the first one-bit VLS circuit and the second one-bit VLS circuit to provide a pair of output signals at the first N-well.

17. An apparatus for reducing die area, and switching power in a two-bit multi-voltage circuit to shift each of two bits from a first voltage level logic to a second voltage level logic, wherein a first N-well formed in a substrate, a second N-well formed in the substrate, adjacent to a side of the first N-well, and a third N-well formed in the substrate, adjacent to a side of the first N-well opposite the second N-well, the apparatus comprising:

logic configured to form a first one-bit voltage level shift (VLS) circuit having a portion on the first N-well and a portion formed on the second N-well; and logic configured to form a second one-bit VLS circuit having a portion on the first N-well and a portion formed on the third N-well;

the first one-bit VLS circuit and the second one-bit VLS circuit to provide a pair of output signals at the first N-well.

18. An apparatus for reducing die area in a two-bit multi-voltage circuit to shift each of two bits from a first voltage level logic to a second voltage level logic, wherein a first N-well formed in a substrate, a second N-well formed in the substrate, adjacent to a side of the first N-well, and a third N-well formed in the substrate, adjacent to a side of the first N-well opposite the second N-well, the apparatus comprising:

means for forming a first one-bit voltage level shift (VLS) circuit having a portion on the first N-well and a portion formed on the second N-well; and means for forming a second one-bit VLS circuit having a portion on the first N-well and a portion formed on the third N-well;

the first one-bit VLS circuit and the second one-bit VLS circuit to provide a pair of output signals at the first N-well.

19. An apparatus for reducing die area in a two-bit multi-voltage circuit to shift each of two bits from a first voltage level logic to a second voltage level logic, wherein a first N-well formed in a substrate, a second N-well formed in the substrate, adjacent to a side of the first N-well, and a third N-well formed in the substrate, adjacent to a side of the first N-well opposite the second N-well, the apparatus comprising:

step for forming a first one-bit voltage level shift (VLS) circuit having a portion on the first N-well and a portion formed on the second N-well; and step for forming a second one-bit VLS circuit having a portion on the first N-well and a portion formed on the third N-well;

the first one-bit VLS circuit and the second one-bit VLS circuit to provide a pair of output signals at the first N-well.

20. A method for reducing die area, and switching power in a four-bit multi-voltage circuit to shift each of four bits from a first voltage level logic to a second voltage level logic, wherein a first N-well formed in a substrate, a second N-well formed in the substrate, adjacent to a side of the first N-well, a third N-well formed in the substrate, adjacent to a side of the first N-well, comprising:

forming a first one-bit voltage level shift (VLS) circuit having a portion on the first N-well and a portion formed the second N-well;

forming a second one-bit VLS circuit having a portion on the first N-well and a portion formed on the second N-well;

forming a third one-bit VLS circuit having a portion on the first N-well and a portion formed the third N-well; and forming a fourth one-bit VLS circuit having a portion on the first N-well and a portion formed the third N-well.

21. An apparatus for reducing die area, and switching power in a four-bit multi-voltage circuit to shift each of four bits from a first voltage level logic to a second voltage level logic, wherein a first N-well formed in a substrate, a second N-well formed in the substrate, adjacent to a side of the first N-well, a third N-well formed in the substrate, adjacent to a side of the first N-well, the apparatus comprising:

logic configured to form a first one-bit voltage level shift (VLS) circuit having a portion on the first N-well and a portion formed the second N-well;

logic configured to form a second one-bit VLS circuit having a portion on the first N-well and a portion formed on the second N-well;

logic configured to form a third one-bit VLS circuit having a portion on the first N-well and a portion formed the third N-well; and logic configured to form a fourth one-bit VLS circuit having a portion on the first N-well and a portion formed the third N-well.

22. An apparatus for reducing die area, and switching power in a four-bit multi-voltage circuit to shift each of four bits from a first voltage level logic to a second voltage level logic, wherein a first N-well formed in a substrate, a second N-well formed in the substrate, adjacent to a side of the first N-well, a third N-well formed in the substrate, adjacent to a side of the first N-well, the apparatus comprising:
- means for forming a first one-bit voltage level shift (VLS) circuit having a portion on the first N-well and a portion formed the second N-well;
- means for forming a second one-bit VLS circuit having a portion on the first N-well and a portion formed on the second N-well;
- means for forming a third one-bit VLS circuit having a portion on the first N-well and a portion formed the third N-well; and
- means for forming a fourth one-bit VLS circuit having a portion on the first N-well and a portion formed the third N-well.

23. An apparatus for reducing die area, and switching power in a four-bit multi-voltage circuit to shift each of four bits from a first voltage level logic to a second voltage level logic, wherein a first N-well formed in a substrate, a second N-well formed in the substrate, adjacent to a side of the first N-well, a third N-well formed in the substrate, adjacent to a side of the first N-well, the apparatus comprising:
- step for forming a first one-bit voltage level shift (VLS) circuit having a portion on the first N-well and a portion formed the second N-well;
- step for forming a second one-bit VLS circuit having a portion on the first N-well and a portion formed on the second N-well;
- step for forming a third one-bit VLS circuit having a portion on the first N-well and a portion formed the third N-well; and
- step for forming a fourth one-bit VLS circuit having a portion on the first N-well and a portion formed the third N-well.

* * * * *